(12) United States Patent
Saito

(10) Patent No.: US 7,119,348 B2
(45) Date of Patent: Oct. 10, 2006

(54) CHARGED BEAM WRITING APPARATUS AND WRITING METHOD

(75) Inventor: Masato Saito, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 10/972,710

(22) Filed: Oct. 26, 2004

(65) Prior Publication Data
US 2005/0167615 A1 Aug. 4, 2005

(30) Foreign Application Priority Data
Oct. 27, 2003 (JP) ............................. 2003-366143

(51) Int. Cl.
H01J 37/08 (2006.01)
G12G 5/00 (2006.01)
(52) U.S. Cl. .............................. 250/492.22; 250/492.3; 250/492.23
(58) Field of Classification Search ............ 250/492.22
See application file for complete search history.

(56) References Cited

U.S. PATENT DOCUMENTS 4,698,509 A * 10/1987 Wells et al. ............. 250/492.2
5,512,747 A * 4/1996 Maeda ....................... 250/310
6,166,387 A * 12/2000 Muraki et al. ........... 250/492.2
2002/0175298 A1* 11/2002 Moniwa et al. ........ 250/492.22
2004/0178366 A1* 9/2004 Ando et al. ............ 250/492.22
2005/0167615 A1* 8/2005 Saito ..................... 250/492.22
2006/0033050 A1* 2/2006 Ando et al. ............ 250/492.22

FOREIGN PATENT DOCUMENTS

JP 59-167018 9/1984
JP 02-138723 5/1990

* cited by examiner

Primary Examiner—John R. Lee
Assistant Examiner—James J. Leybourne
(74) Attorney, Agent, or Firm—Finnegan, Henderson, Farabow, Garrett & Dunner, L.L.P.

(57) ABSTRACT

A charged beam writing apparatus is disclosed, which comprises a shaped beam forming unit which shapes a charged beam radiated from a charged beam source into a beam of a desired shape by using at least two shaping masks each having a shaping aperture to form a shaped beam, a figure dividing unit which divides a contour portion of a pattern to be formed on an object layer into a plurality of figure portions having a predetermined area, a writing unit which writes the figure portions of the contour portion by using a shaped beam of the predetermined area, and a focus control unit which performs focusing of the beam radiated from the charged beam source, by using a shaped beam having the same area as that of the shaped beam which has the predetermined area and is used in writing of the figure portions of the contour portion.

20 Claims, 3 Drawing Sheets

CHARGED BEAM WRITING APPARATUS AND WRITING METHOD

CROSS-REFERENCE TO RELATED APPLICATIONS

This application is based upon and claims the benefit of priority from prior Japanese Patent Application No. 2003-366143, filed Oct. 27, 2003, the entire contents of which are incorporated herein by reference.

BACKGROUND OF THE INVENTION

1. Field of the Invention

This invention relates to a charged beam writing technique which writes a fine device pattern for a semiconductor integrated circuit or the like on an object by using a charged beam, in particular, a charged beam writing apparatus and writing method adopting a beam shaping system.

2. Description of the Related Art

In conventional art, there have been used a method of transferring a pattern by light, and a method of writing a pattern by using a charged beam such as an ion beam and an electron beam, to form the pattern on a substrate such as a semiconductor wafer and a mask. In particular, there has been mainly used an electron beam writing apparatus adopting a beam shaping system, in which an electron beam radiated from an electron beam source is shaped into desired shape and size and a pattern is written on a substrate by using the shaped beam, to manufacture a mask to be used for a lens projection aligner.

In an electron beam writing apparatus adopting a beam shaping system, writing of an internal portion of a pattern is performed by using a beam of a maximum size, i.e., a beam of an upper-limit size, which is provided by a beam shaping unit of the beam writing apparatus, and a contour portion of the pattern is divided by a figure having a beam size restricted in view of the space-charge effect and writing of the contour portion of the pattern is performed by using a beam of the restricted beam size (for example, refer to Jpn. Pat. Appln. KOKAI Pub. No. 59-167018, and Jpn. Pat. Appln. KOKAI Pub. No. 2-138723). In this method, a fixed beam size is used in the pattern contour portion, and thus no difference in the beam size is generated between individual figure portions in the pattern contour portion. Specifically, no difference in the beam resolution is generated between the individual figure portions in the pattern contour portion. Further, the internal portion of the pattern is divided by a large figure, the number of the figure portions is reduced, and increase in the writing time can be suppressed.

However, when the inventor of the present invention actually wrote a pattern by using an electron beam writing apparatus of the above method, actually there was decrease in the writing accuracy considered as being caused by the space-charge effect. It is inferred that this is because the beam size used in writing in the apparatus is different from the beam size in focusing. In an electron beam writing apparatus adopting the beam shaping system, focusing is performed by using a beam of a desired size prior to writing.

As described above, in the conventional electron beam writing apparatus adopting the beam shaping system, the beam resolution in writing is different from that in focusing due to the space-charge effect, and thus patterning accuracy is decreased with this.

BRIEF SUMMARY OF THE INVENTION

According to an aspect of the present invention there is provided a charged beam writing apparatus adopting a beam shaping system, comprising:

a shaped beam forming unit which shapes a charged beam radiated from a charged beam source into a beam of a desired shape by using at least two shaping masks each having a shaping aperture to form a shaped beam;

a figure dividing unit which divides a contour portion of a pattern to be formed on an object layer into a plurality of figure portions having a predetermined area;

a writing unit which writes the figure portions of the contour portion by using a shaped beam of the predetermined area; and a focus control unit which performs focusing of the beam radiated from the charged beam source, by using a shaped beam having the same area as that of the shaped beam which has the predetermined area and is used in writing of the figure portions of the contour portion by the writing unit.

According to another aspect of the present invention there is provided a charged beam writing apparatus adopting a beam shaping system, comprising:

a shaped beam forming unit which shapes a charged beam radiated from a charged beam source into a beam of a desired shape by using at least two shaping masks each having a shaping aperture to form a shaped beam;

a figure dividing unit which divides a contour portion of a pattern to be formed on an object layer into a plurality of figure portions having a predetermined width;

a writing unit which writes the figure portions of the contour portion by using a shaped beam of the predetermined width; and a focus control unit which performs focusing of the beam radiated from the charged beam source, by using a shaped beam having the same width as that of the shaped beam which has the predetermined width and is used in writing of the figure portions of the contour portion by the writing unit.

According to a further aspect of the present invention there is provided a charged beam writing method comprising:

shaping a charged beam radiated from a charged beam source into a beam of a desired shape by using at least two shaping masks each having a shaping aperture to form a shaped beam;

dividing a contour portion of a pattern to be formed on an object layer into a plurality of figure portions having a predetermined area; and writing the figure portions of the contour portion by using a shaped beam of the predetermined area;

the method further comprising:

performing focusing of the beam radiated from the charged beam source in advance, before writing the pattern, by using a shaped beam having the same area as that of the shaped beam which has the predetermined area and is used in writing of the figure portions of the contour portion.

According to a further aspect of the present invention there is provided a charged beam writing method comprising:

shaping a charged beam radiated from a charged beam source into a beam of a desired shape by using at least two shaping masks each having a shaping aperture, and forming a shaped beam;

dividing a contour portion of a pattern to be formed on an object layer into a plurality of figure portions having a predetermined width; and writing the figure portions of the contour portion by using a shaped beam of the predetermined width;

the method further comprising:

performing focusing of the beam radiated from the charged beam source in advance, before writing the pattern, by using a shaped beam having the same width as that of the shaped beam which has the predetermined width and is used in writing of the figure portions of the contour portion.

According to a further aspect of the present invention there is provided a method of manufacturing a semiconductor device comprising:

setting a supporting stage having a semiconductor substrate mounted thereon in a charged beam writing apparatus at a predetermined position thereof;

dividing a contour portion of a pattern to be formed on the semiconductor substrate into a plurality of figure portions having a predetermined area;

writing the figure portions of the contour portion on the semiconductor substrate, by using a shaped beam of a predetermined area formed by shaping a charged beam radiated from a charged beam source into a beam of a desired shape by using at least two shaping masks each having a shaping aperture; and processing the written pattern by using lithography and etching to form the pattern on the semiconductor substrate;

the method further comprising:

performing focusing of the beam radiated from the charged beam source in advance, before writing the pattern, by using a shaped beam having the same area as that of the shaped beam which has the predetermined area and is used in writing of the figure portions of the contour portion.

According to a further aspect of the present invention there is provided a method of manufacturing a semiconductor device comprising:

setting a supporting stage having a semiconductor substrate mounted thereon in a charged beam writing apparatus at a predetermined position thereof;

dividing a contour portion of a pattern to be formed on the semiconductor substrate into a plurality of figure portions having a predetermined width;

writing the figure portions of the contour portion on the semiconductor substrate, by using a shaped beam of a predetermined width formed by shaping a charged beam radiated from a charged beam source into a beam of a desired shape by using at least two shaping masks each having a shaping aperture; and processing the written pattern by using lithography and etching to form the pattern on the semiconductor substrate;

the method further comprising:

performing focusing of the beam radiated from the charged beam source in advance, before writing the pattern, by using a shaped beam having the same width as that of the shaped beam which has the predetermined width and is used in writing of the figure portions of the contour portion.

DETAILED DESCRIPTION OF THE INVENTION

An embodiment of the present invention is explained below with reference to drawings.

Figure 1:
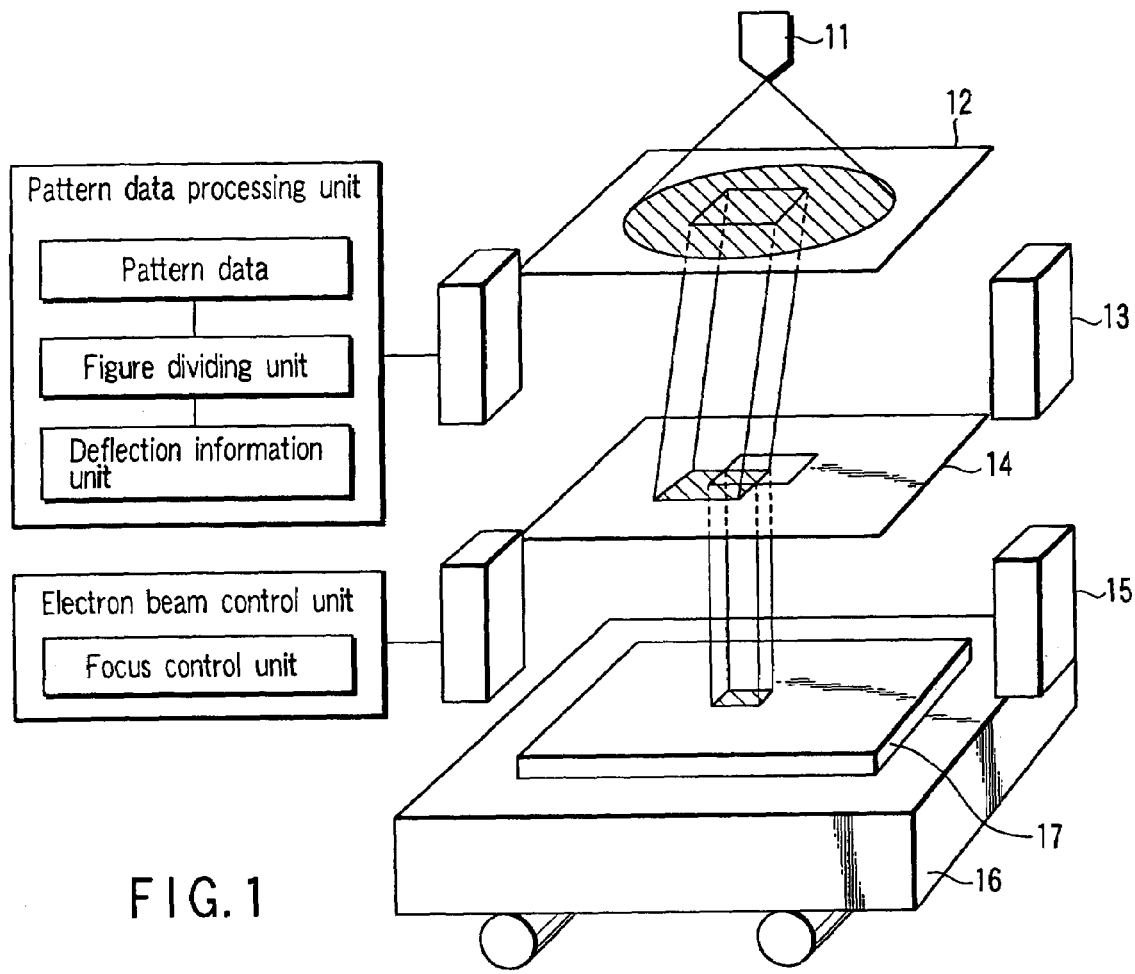
FIG. 1 is a schematic block diagram of an electric beam writing apparatus according to an embodiment of the present invention.

FIG. 1 is a schematic block diagram of an electric beam writing apparatus according to an embodiment of the present invention.

An electron beam radiated from an electron beam source 11 such as an electron gun is made incident on a first mask 12 having a first shaping aperture 12a, and passes through the aperture 12a. The electron beam is shaped into the shape of the aperture 12a when it passes through the aperture 12a. The electron beam shaped by the aperture 12a is made incident on a second mask 14 having a second shaping aperture 14a through a projection lens (not shown). An electron beam deflector 13 is provided in the vicinity of an electron beam path between the first and second masks 12 and 14. The deflector 13 deflects the electron beam which has passed through the first shaping aperture 12a and then is made incident onto the second shaping aperture 14a to control the incident position of the beam on the second shaping aperture 14a. Thereby, an electron beam of desired shape and size is obtained through the second shaping aperture 14a of the second mask 14. Specifically, an electron beam of desired shape and size is obtained by beam deflection by a shaped beam forming unit comprising the first and second masks 12 and 14 arranged in a superposed manner and the beam deflector 13.

The beam obtained through the second shaping aperture 14a of the second mask 14 is made incident on a substrate 17, such as a semiconductor wafer, placed on a stage 16 through an objective (not shown), and an image is formed thereon. A scanning deflector 15 is provided in the vicinity of an electron beam path between the second mask 14 and the substrate 17. The beam obtained through the second shaping aperture 14a is then made incident onto the substrate 17, to be positioned on a predetermined position thereof by the deflector 15. Thereby, a desired pattern, such as a desired integrated circuit pattern, is written on the substrate 17. As described later, in the scanning of a mark used for beam positioning and beam focus adjustment, the deflector 15 is used to scan the beam for a reflected beam detection.

A mark formed of fine particles or the like is provided on an upper surface of the stage 16, though not shown. The mark is used for positioning and focusing of the beam prior to arrangement of the substrate 17 onto the stage 16. Further, a reflected electron detector, not shown, is provided above the stage 16, to detect reflected electrons generated when the beam is scanned on the mark.

The above is a basic structure of the apparatus, which is the same as a conventional writing apparatus. The apparatus of the present embodiment is different from the conventional one in a division mode of a pattern to be written and in a beam adjustment mode performed as a previous step of writing.

There is a phenomenon called as a space-charge effect, which is a characteristic of a charged beam represented by an electron beam. This is a phenomenon that the focus position of the beam is shifted and the energy dispersion of the beam is fluctuated due to repulsion of charges of the beam, and resolution of the beam is decreased. The decrease of the beam resolution depends on the amount of the current. In an electron beam writing apparatus adopting a beam shaping system in which a beam of a desired shape is formed by shaping a beam of a fixed current density, the beam current is proportional to a cross section of the formed beam, and consequently the resolution differs according to the beam area.

Figure 2:
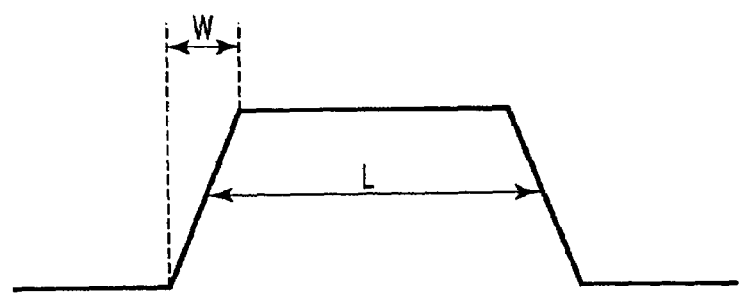
FIG. 2 is a diagram illustrating a profile of an electron beam.
Figure 3:
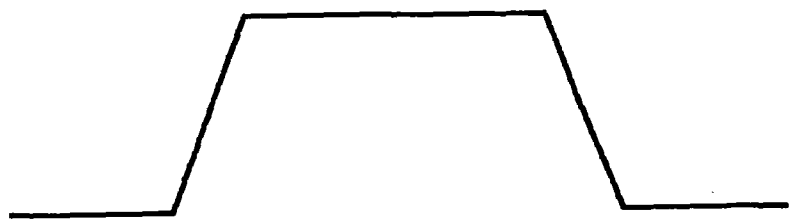
FIG. 3 is a diagram illustrating a profile of a beam having a high resolution.
Figure 4:
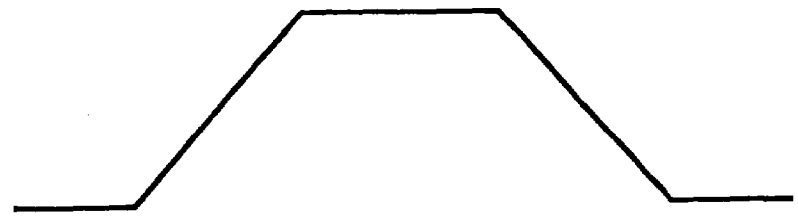
FIG. 4 is a diagram illustrating a profile of a beam having a low resolution.

FIG. 2 illustrates a profile of intensity of a beam. The horizontal axis denotes the size of the beam, and the vertical axis denotes the intensity of the beam. The resolution of the beam is defined by width W at an end portion of the profile, and the size of the beam is defined by width L of a portion in which the intensity (height) of the profile is ½ the maximum value. FIGS. 3 and 4 illustrate profiles of a beam having a high resolution and a beam having a low resolution, respectively, on the basis of the definitions. FIG. 3 is a profile of a beam having a high resolution, and FIG. 4 is a profile of a beam having a low resolution.

In an electron beam writing apparatus adopting a beam shaping system, writing of an internal portion of a pattern is performed by using a beam of a maximum size, i.e., a beam of an upper-limit size, which is provided by a beam shaping unit of the beam shaping unit, and a contour portion of the pattern is divided by a figure having a beam size restricted in view of the space-charge effect and writing of the contour portion of the pattern is performed by using a beam of the restricted beam size.

Generally, a pattern to be written (pattern data) includes figures having various sizes and various shapes. When a pattern is actually written, the pattern is divided into figure portions each having the maximum beam size or a size smaller than the maximum beam size, by a figure dividing unit 19 in a pattern data processing unit 18. The figure portions obtained by division are different from each other according to their regions in the pattern. The beam shape (beam area) determined by the figure dividing unit 19 is converted into a deflection information by a deflection information converting unit 20. The deflector 13 deflects the electron beam which has passed through the first shaping aperture 12a and then is made incident onto the second shaping aperture 14a, on the basis of the deflection information of the deflection information converting unit 20. Thereby, an electron beam of desired shape and size is obtained through the second shaping aperture 14a of the second mask 14. The beam obtained through the second shaping aperture 14a of the second mask 14 is made incident onto the substrate 17, to be positioned on a predetermined portion thereof by the deflector 15. Thereby, a desired pattern, such as a desired integrated circuit pattern, is written on the substrate 17. In writing, a beam of the maximum beam size and a beam of a size smaller than the maximum beam size are used according to the sizes of the figure portions obtained by division. Such a mode of writing is substantially equal to a mode of writing by using beams of different resolutions according to regions in the pattern, and the shape and the size of the pattern, in consideration of change in the beam resolution by the space-charge effect described above.

Figure 5:
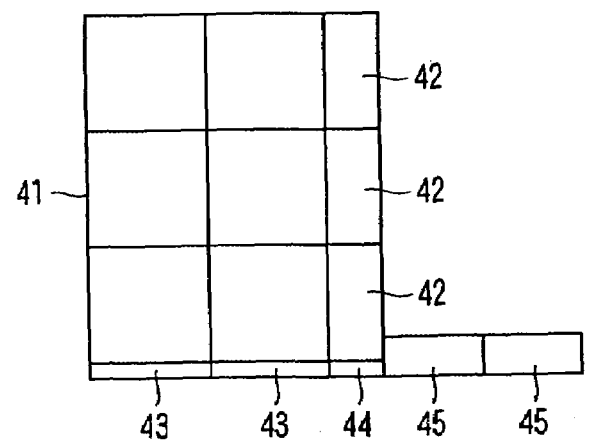
FIG. 5 is a diagram illustrating a state in which a contour portion of a pattern to be written is divided into figure portions which are smaller than a maximum beam size.

FIG. 5 is a form of division of a pattern. In FIG. 5, a pattern is divided into figures each having the maximum beam size or a size smaller than the maximum beam size, and the shapes of the figure portions obtained by division are different according to their regions in the pattern. In FIG. 5, reference numeral 41 denotes a figure portion having the maximum beam size. Reference numerals 42, 43, 44 and 45 are figure portions having beam sizes smaller than the maximum beam size. The beam sizes of the figure portions 42, 43, 44 and 45 are different from each other.

In manufacturing of a semiconductor device, an electron beam is made incident on an object layer, such as a metal layer, coated with a resist, and then a pattern is formed on the object layer by performing processes such as development and etching. The patterning accuracy greatly depends on the beam resolution. Generally, the better the beam resolution is, the better fidelity to the pattern the formed pattern has.

Figure 6:
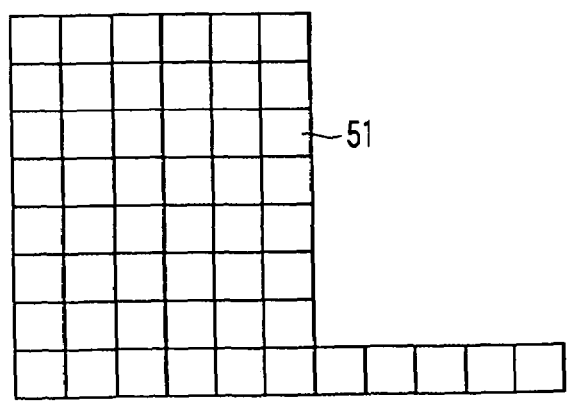
FIG. 6 is a diagram illustrating a state in which a whole pattern to be written is divided into figure portions having the same size.

As a method of enhancing the fidelity, there is a method in which the whole pattern is divided into figures having the same size and shape, and writing is performed by using a beam of the same size and shape. FIG. 6 illustrates a mode of division of a pattern. In FIG. 6, the pattern is divided into figure portions 51 having the same size and the same shape, and thus the resolution of the beam does not vary between positions of the figure portions in the pattern. However, in the case of using this method, the size of the figure portions of the FIG. 51 has to be set to a size of a divided portion of a region which has to be divided into figures of the minimum size. This increases the number of the figure portions, and increases the time required for pattern writing.

Therefore, in the embodiment, a pattern contour portion is divided into figures having the same size and shape in pattern writing, and the beam of the same size and shape is used in the pattern contour portion. This is based on the viewpoint that a pattern contour portion mainly has an influence on patterning accuracy.

Figure 7:
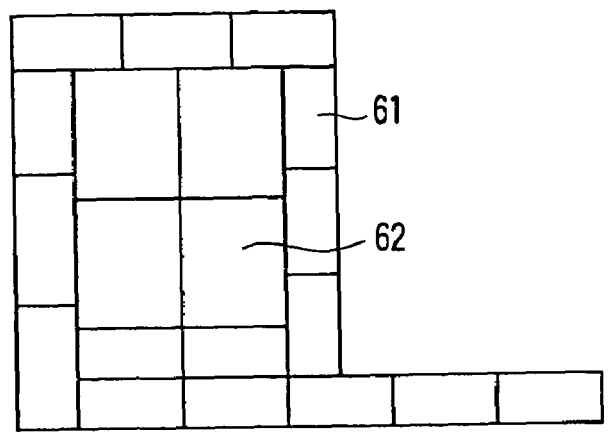
FIG. 7 is a diagram illustrating a state of pattern division in the embodiment of the present invention, in which a contour portion of a pattern is divided into figure portions having the same size.

FIG. 7 illustrates a mode of division of a contour portion of a pattern, according to the embodiment. The contour portion is divided into figures having the same size and shape. The size is smaller than the maximum size. Specifically, the contour portion is divided into figure portions 61 having the same size and shape, which are smaller than the maximum size. Therefore, in writing, a beam having the same beam size and shape which is smaller than the maximum beam size is used for the contour portion. In the meantime, the internal portion of the pattern is divided into figures having the maximum size corresponding to the maximum size of a shaped beam provided by the shaped beam forming unit, that is, the internal portion is divided into figure portions 62 each having a size of the maximum beam size. Specifically, in writing, a beam of the maximum beam size is used for the internal portion of the pattern. As described above, in this embodiment, the internal portion is divided into figures of the maximum size, that is, figure portions 62 having the maximum beam size. Therefore, the number of figure portions is reduced in comparison with the number of figure portions in the mode shown in FIG. 6, and the time required for pattern writing is shortened.

In manufacturing of a semiconductor device such as a MOS transistor, a gate insulating film is formed on a semiconductor substrate, and then a polysilicon layer which is processed into a gate electrode is formed on the gate insulating film. Thereafter, a resist layer is formed on the polysilicon layer, and then the resist layer is subjected to patterning to form a mask, that is, a resist pattern used in patterning for processing the polysilicon layer into a gate electrode. In patterning of the resist layer, the semiconductor substrate is placed on a supporting stage of a writing apparatus, and the pattern writing of the embodiment is used for the semiconductor substrate. The pattern writing provides a resist pattern of high accuracy and shortens the writing time. Thereafter, with the high-accuracy resist pattern used as mask, the polysilicon layer is processed into a gate electrode by known lithography and etching. Then, with the gate electrode used as mask, impurities are implanted into regions in which a source or a drain is to be formed, and source/drain regions are formed in self-align scheme with the gate electrode. By this process, an MOS transistor is formed. In this manufacturing method, the pattern writing of the embodiment is used in patterning of the resist layer, and thereby the high-accuracy resist pattern is obtained. Therefore, the gate electrode obtained by processing the polysilicon layer with the high-accuracy resist pattern used as mask has high accuracy, and performance of the MOS transistor to be formed is improved correspondingly. Further, the manufacturing time of the MOS transistor is shortened in proportion to shortened time in the writing time for obtaining the resist pattern.

In addition, the embodiment sets the shape and size of the beam used in focusing of the beam to be the same as the shape and size of the beam used in writing of the contour portion of the pattern.

Figure 8:
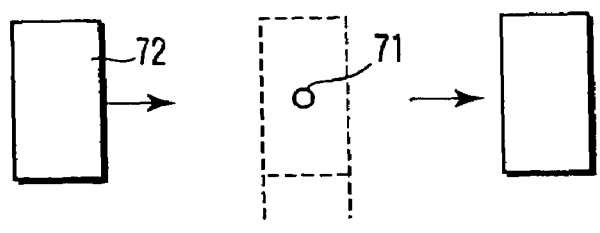
FIG. 8 is a diagram illustrating a state of scanning over a fine mark formed on a supporting stage.
Figure 9:
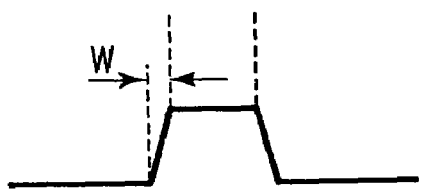
FIG. 9 illustrates a profile of a reflected beam generated by scanning as shown in FIG. 8.

Focus of the beam is controlled by a focus control unit 22 in a beam control unit 21. In focusing of the beam, as shown in FIG. 8, a beam 72 having the same shape and size as those of the beam used for writing for the contour portion of the pattern is scanned over a fine mark 71 formed on the surface of the stage 16. A reflected electron detector (not shown) detects reflected electrons generated by the scanning, and a reflection beam profile as shown in FIG. 9 is obtained. Further, an exciting current or an exciting voltage of the lens system including the objective is adjusted by control by the focus control unit 22, such that the length of an edge portion W of the reflection beam profile becomes shortest, that is, the rise and fall of the reflection beam profile become steep. Focusing is achieved by setting the rise and fall of the reflection beam profile steep.

Figure 10:
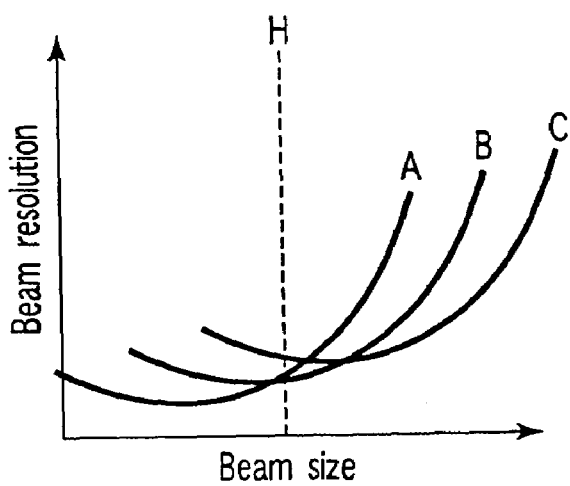
FIG. 10 is a diagram illustrating a correlation between the beam size and the beam resolution when focus position adjustment is performed by using beams of a larger size, the same size, and a smaller size in comparison with the size of a beam used for writing of the contour portion of a pattern.

FIG. 10 illustrates a correlation between the beam size and the beam resolution after beam focusing is performed by beam A, beam C and beam B. The beam A has a size smaller than the beam size H of the beam used for writing of the contour portion, the beam C has a size larger than the beam size H, and the beam B has the same size as the beam size H. As is clear from FIG. 10, if beam focusing is performed with the beam A or C each having the size different from that of the beam used for writing of the contour portion, the contour portion is written with a low beam resolution.

In this embodiment, the beam size of the beam B used for writing of the contour portion is set to be the same as the beam size H of the beam used for beam focusing. Thereby, the beam B having the same resolution as that of the beam used for beam focusing is used in writing of the contour portion, and thus pattern writing can be performed with the beam of high resolution, regardless of the region and shape of the pattern.

As described above, according to the embodiment, in the electron beam writing apparatus adopting the beam shaping system, the contour portion of the pattern is written by a beam of the same shape and size, and beam focusing is performed by using a beam of the same shape and size as those of the beam used for writing of the contour portion. This suppresses decrease in the patterning accuracy due to fluctuations in the beam resolution caused by the space-charge effect, and improves the writing accuracy with decrease in the writing speed suppressed to the minimum.

In the above embodiment, although the beam used for writing of the contour portion is set to have the same shape and size as those of the beam used in focusing, the beams may be different in the shape, as long as they are the same in the area. This is because the area is a factor which has the largest influence on the space-charge effect. Decrease in the beam resolution is reduced to the minimum if the beams are the same in the area. Further, the beams are not necessarily have the same area, but it suffices that they have the same beam width. Also in this case, the beam resolution is not greatly decreased, although decrease in the beam resolution is less suppressed in comparison with the case where the beams have the same area.

The present invention is not limited to the above embodiment. Although an electron beam writing apparatus is explained as an example in the above embodiment, the present invention is also applicable to an ion beam writing apparatus in the same manner. Further, the structure of the writing apparatus is not limited to that shown in FIG. 1. It suffices that the writing apparatus has a structure of shaping a beam by using a plurality of shaping apertures.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged beam writing apparatus adopting a beam shaping system, comprising:
    a shaped beam forming unit which shapes a charged beam radiated from a charged beam source into a beam of a desired shape by using at least two shaping masks each having a shaping aperture to form a shaped beam;
    a figure dividing unit which divides a contour portion of a pattern to be formed on an object layer into a plurality of figure portions having a predetermined area;
    a writing unit which writes the figure portions of the contour portion by using a shaped beam of the predetermined area; and
    a focus control unit which performs focusing of the beam radiated from the charged beam source, by using a shaped beam having the same area as the shaped beam which is used in writing the figure portions of the contour portion by the writing unit.

2. A charged beam writing apparatus according to claim 1, wherein an internal portion of the pattern is written by using a shaped beam having a maximum area which is provided by the shaped beam forming unit.

3. A charged beam writing apparatus according to claim 2, wherein the predetermined area of the shaped beam used in writing of the figure portions of the contour portion is smaller than the maximum area of the shaped beam used in writing of the internal portion of the pattern.

4. A charged beam writing apparatus according to claim 1, wherein the focus control unit scans a mark provided on a supporting stage of the object layer, by using a shaped beam having the same area as that of the shaped beam of the predetermined area used in writing of the figure portions of the contour portion, and adjusts a lens system such that a rise or fall of an intensity profile of a reflected beam of the shaped beam is steep.

5. A charged beam writing apparatus adopting a beam shaping system, comprising:
- a shaped beam forming unit which shapes a charged beam radiated from a charged beam source into a beam of a desired shape by using at least two shaping masks each having a shaping aperture to form a shaped beam;
- a figure dividing unit which divides a contour portion of a pattern to be formed on an object layer into a plurality of figure portions having a predetermined width;
- a writing unit which writes the figure portions of the contour portion by using a shaped beam of the predetermined width; and
- a focus control unit which performs focusing of the beam radiated from the charged beam source, by using a shaped beam having the same width as the shaped beam which is used in writing the figure portions of the contour portion by the writing unit.

6. A charged beam writing apparatus according to claim 5, wherein an internal portion of the pattern is written by using a shaped beam having a maximum width which is provided by the shaped beam forming unit.

7. A charged beam writing apparatus according to claim 6, wherein the predetermined width of the shaped beam used in writing of the figure portions of the contour portion is smaller than the maximum width of the shaped beam used in writing of the internal portion of the pattern.

8. A charged beam writing apparatus according to claim 5, wherein the focus control unit scans a mark provided on a supporting stage of the object layer, by using a shaped beam having the same width as that of the shaped beam of the predetermined width used in writing of the figure portions of the contour portion, and adjusts a lens system such that a rise or fall of an intensity profile of a reflected beam of the shaped beam is steep.

9. A charged beam writing method comprising:
- shaping a charged beam radiated from a charged beam source into a beam of a desired shape by using at least two shaping masks each having a shaping aperture to form a shaped beam;
- dividing a contour portion of a pattern to be formed on an object layer into a plurality of figure portions having a predetermined area; and
- writing the figure portions of the contour portion by using a shaped beam of the predetermined area;
- the method further comprising:
- performing focusing of the beam radiated from the charged beam source in advance, before writing the pattern, by using a shaped beam having the same area as the shaped beam which is used in writing the figure portions of the contour portion.

10. A charged beam writing method according to claim 9, wherein an internal portion of the pattern is written by using a shaped beam having a maximum area which is provided by a shaped beam forming unit.

11. A charged beam writing method according to claim 10, wherein the predetermined area of the shaped beam used in writing of the figure portions of the contour portion is smaller than the maximum area of the shaped beam used in writing of the internal portion of the pattern.

12. A charged beam writing method according to claim 9, wherein the focus control unit scans a mark provided on a supporting stage of the object layer, by using a shaped beam having the same area as that of the shaped beam of the predetermined area used in writing of the figure portions of the contour portion, and adjusts a lens system such that a rise or fall of an intensity profile of a reflected beam of the shaped beam is steep.

13. A charged beam writing method comprising:
- shaping a charged beam radiated from a charged beam source into a beam of a desired shape by using at least two shaping masks each having a shaping aperture, and forming a shaped beam;
- dividing a contour portion of a pattern to be formed on an object layer into a plurality of figure portions having a predetermined width; and
- writing the figure portions of the contour portion by using a shaped beam of the predetermined width;
- the method further comprising:
- performing focusing of the beam radiated from the charged beam source in advance, before writing the pattern, by using a shaped beam having the same width as the shaped beam which is used in writing the figure portions of the contour portion.

14. A charged beam writing method according to claim 13, wherein an internal portion of the pattern is written by using a shaped beam having a maximum width which is provided by a shaped beam forming unit.

15. A charged beam writing method according to claim 14, wherein the predetermined width of the shaped beam used in writing of the figure portions of the contour portion is smaller than the maximum width of the shaped beam used in writing of the internal portion of the pattern.

16. A charged beam writing method according to claim 13, wherein the focus control unit scans a mark provided on a supporting stage of the object layer, by using a shaped beam having the same width as that of the shaped beam of the predetermined width used in writing of the figure portions of the contour portion, and adjusts a lens system such that a rise or fall of an intensity profile of a reflected beam of the shaped beam is steep.

17. A method of manufacturing a semiconductor device comprising:
- setting a supporting stage having a semiconductor substrate mounted thereon in a charged beam writing apparatus at a predetermined position thereof;
- dividing a contour portion of a pattern to be formed on the semiconductor substrate into a plurality of figure portions having a predetermined area;
- writing the figure portions of the contour portion on the semiconductor substrate, by using a shaped beam of a predetermined area formed by shaping a charged beam radiated from a charged beam source into a beam of a desired shape by using at least two shaping masks each having a shaping aperture; and processing the written pattern by using lithography and etching to form the pattern on the semiconductor substrate;
- the method further comprising:
- performing focusing of the beam radiated from the charged beam source in advance, before writing the pattern, by using a shaped beam having the same area as the shaped beam which is used in writing the figure portions of the contour portion.

18. A method of manufacturing a semiconductor device according to claim 17, wherein an internal portion of the pattern is written by using a shaped beam having a maximum area which is provided by a shaped beam forming unit, and the predetermined area of the shaped beam used in writing of the figure portions of the contour portion is smaller than the maximum area of the shaped beam used in writing of the internal portion of the pattern.

19. A method of manufacturing a semiconductor device comprising:

setting a supporting stage having a semiconductor substrate mounted thereon in a charged beam writing apparatus at a predetermined position thereof;

dividing a contour portion of a pattern to be formed on the semiconductor substrate into a plurality of figure portions having a predetermined width; writing the figure portions of the contour portion on the semiconductor substrate, by using a shaped beam of a predetermined width formed by shaping a charged beam radiated from a charged beam source into a beam of a desired shape by using at least two shaping masks each having a shaping aperture; and processing the written pattern by using lithography and etching to form the pattern on the semiconductor substrate;

the method further comprising:

performing focusing of the beam radiated from the charged beam source in advance, before writing the pattern, by using a shaped beam having the same width as the shaped beam which is used in writing the figure portions of the contour portion.

20. A method of manufacturing a semiconductor device according to claim 19, wherein an internal portion of the pattern is written by using a shaped beam having a maximum width which is provided by a shaped beam forming unit, and the predetermined width of the shaped beam used in writing of the figure portions of the contour portion is smaller than the maximum width of the shaped beam used in writing of the internal portion of the pattern.

* * * * *